United States Patent [19]
Monger

[11] 3,965,467
[45] June 22, 1976

[54] ANALOG-TO-DIGITAL CONVERTERS
[76] Inventor: Raymond Frederick Monger, Red Gables, Ruston Park, Rustington, Sussex, England
[22] Filed: Aug. 12, 1974
[21] Appl. No.: 497,120

[52] U.S. Cl............................ 340/347 NT; 324/99 D
[51] Int. Cl.² ........................................ H03K 13/02
[58] Field of Search............... 340/347 NT, 347 AD, 340/347 CC; 324/99 D

[56] References Cited
UNITED STATES PATENTS

| | | | |
|---|---|---|---|
| 2,994,825 | 8/1961 | Anderson | 340/347 NT |
| 3,368,149 | 2/1968 | Wasserman | 340/347 AD |
| 3,480,948 | 11/1969 | Lord | 340/347 AD |
| 3,509,460 | 4/1970 | Mizrahi | 340/347 CC |
| 3,566,265 | 2/1971 | Reid | 340/347 NT |
| 3,725,903 | 3/1973 | Kosakowski | 340/347 AD |
| 3,750,142 | 7/1973 | Barnes et al. | 340/347 CC |
| 3,760,407 | 9/1973 | Terry | 340/347 NT |
| 3,872,466 | 3/1975 | Wold | 340/347 AD |
| 3,905,028 | 9/1975 | Wintz et al. | 340/347 NT |

Primary Examiner—Thomas J. Sloyan
Attorney, Agent, or Firm—Dowell & Dowell

[57] ABSTRACT

The analog-to-digital converter comprises a comparator having first and second inputs, and an output. A first switch is capable of connecting a signal to be measured to the first input and a second switch can connect a reference source to said first input. A capacitor is connected between said second input and the reference source and serves to store a charge fed by way of a feed back loop from the output of the comparator. The feed back loop includes current generator means arranged to provide a positive or negative current at the second input until the charge is equalized and change of state occurs at the comparator output. A selector means determines the polarity of the current from the generator means depending upon the state of the output from the comparator. A counter determines the number of counting pulses emitted from a pulse generator during a counting period in which the current generator means is applied to the comparator. After the counting period a settling period occurs where the charge on the capacitor is held and then a discharge period follows in which the capacitor is discharged via the current generator means by means of a current of opposite polarity to that used during the charging period. The measurement cycle thus comprises four periods which include two active and two non-active portions.

9 Claims, 6 Drawing Figures

ANALOG-TO-DIGITAL CONVERTERS

BACKGROUND OF THE INVENTION

This invention relates to an analog-to-digital converter particularly, but not solely for use in measuring low level d.c. voltages.

Normal methods of making low level voltage measurements are by the use of one of the many well known analog-to-digital converters preceded by a low level, low drift amplifier. The main disadvantage of these systems is the high cost of low level, low drift amplifiers. They are difficult to manufacture and use up valuable instrument space.

An object of the invention is to provide a system in which the problems of drift in the system are eliminated or made negligible.

SUMMARY OF THE INVENTION

According to the invention there is provided an analog-to-digital converter comprising a comparator having first and second inputs and an output, a first switch for connecting a first signal level to said first input, a second switch for connecting a second signal level to said first input, said switches being capable of alternate switching, a storage device connected between said second input and a reference level, current generator means for providing either a positive or negative current at said second input until a change of state occurs at the output of the comparator, selector means for determining the polarity of the current from said generator means depending upon the state of the output from the comparator, a pulse generator, and counter means for determining the number of counting pulses emitted from the pulse generator during a counting period in which the current generator means is applied to the comparator.

BRIEF DESCRIPTION OF DRAWINGS

The invention will now be described by way of example with reference to the accompanying drawings in which.

DESCRIPTION OF PREFERRED EMBODIMENT

Figure 1:
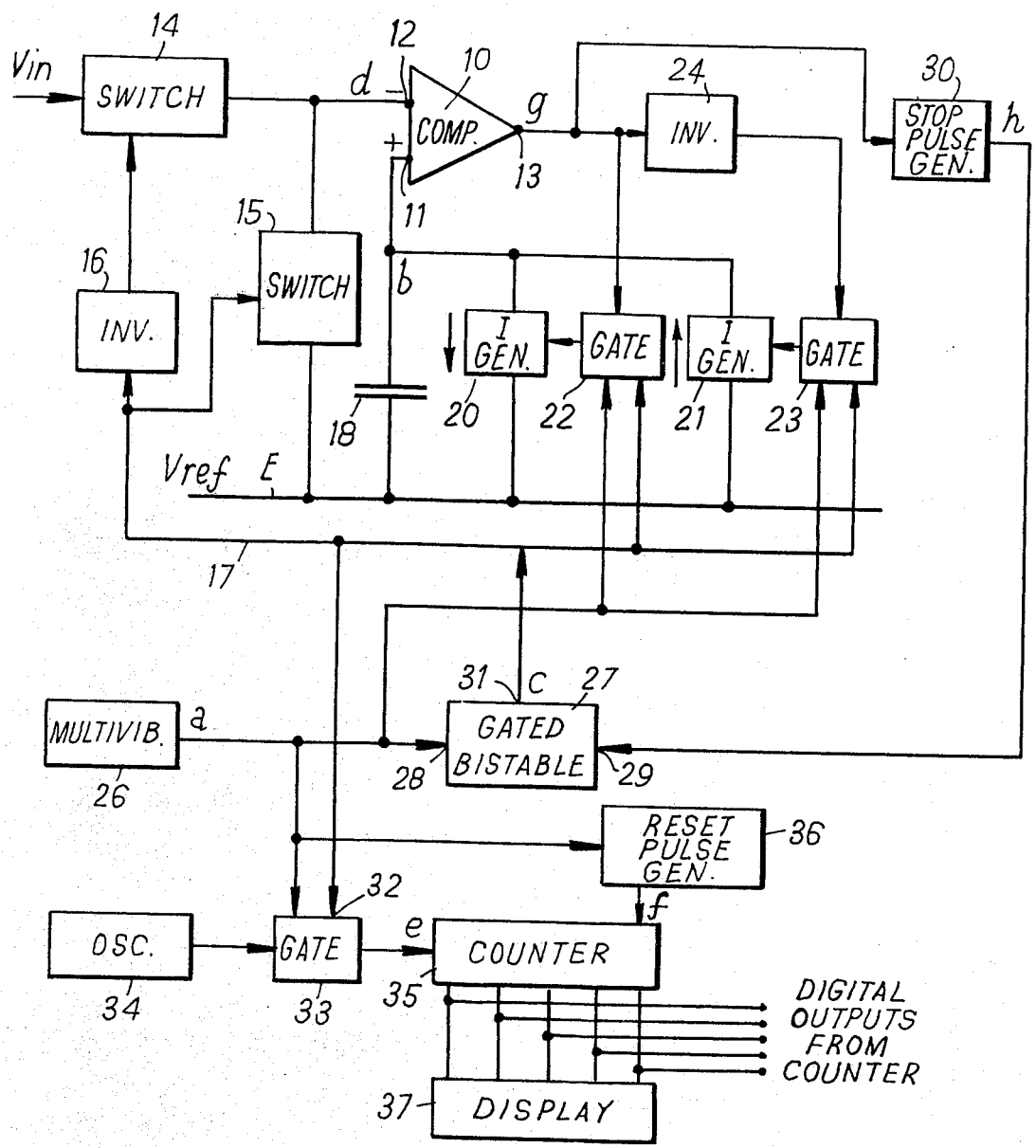
FIG. 1 is a block circuit diagram of a digital voltmeter incorporating one embodiment of the present invention.

The block circuit diagram of FIG. 1 comprises a comparator 10 which includes a differential amplifier having a non-inverting (positive) input 11 and an inverting (negative) input 12 and an output 13. The comparator is capable of providing binary control at the output 13 so that whenever the voltages at the two inputs 11, 12 become equal there is a change of state at the output 13. If the voltage at input 12 is initially more positive than the voltage at input 11, a state 0 is present at the comparator output.

The negative input 12 is connected to the output terminal of a switch 14, to the input of which a first signal level, e.g. a signal to be measured, is applied. A second switch 15 is connected to the negative input 12 and is adapted to receive a second signal level, which is preferably a fixed reference $V_{ref}$. In the example shown, the switch 15 is connected to the common earth rail E. Both of the switches 14 and 15 have a control input. An inverter 16 is provided between a control line 17 and the control input of the switch 14. The control line is directly connected to the control input of the switch 15, so that switch 15 is open when switch 14 is closed for a state 1 on the control line and a change of state appearing on the control line effects a reversal of the switch conditions.

A capacitor 18 is connected between the earth rail E and the positive input 11 and serves to hold a charge fed by way of a feed back loop from the output of the comparator. In the feed back loop there are provided a pair of current generators 20, 21 for providing negative or positive current respectively to the line of connection between the capacitor and the positive input 11 of the comparator. The loop also comprises an inverter 24 and a pair of gates 22, 23 controlling respectively the current generators 20, 21.

The gates 22, 23 have three inputs, a first input connected to the comparator 13 (directly as with gate 22 or via an inverter 24 as with gate 23), a second input connected to the control line 17 from the output 31 of a gated bistable 27, and a third input connected to the output of a multivibrator 26.

Gates 22 and 23 are enabled when their second and third inputs are at the same state (i.e., 1 and 1, alternatively 0 and 0). When enabled, the gates will have a 1 at their output for a 1 at their first input. Alternatively they will have a 0 at their output for a 0 at their input. Gates 22 and 23 are not enabled when their second and third inputs are at different states (i.e., 0 and 1, alternatively 1 and 0). When not enabled, the gates will always have a 0 at their outputs.

Figure 4:
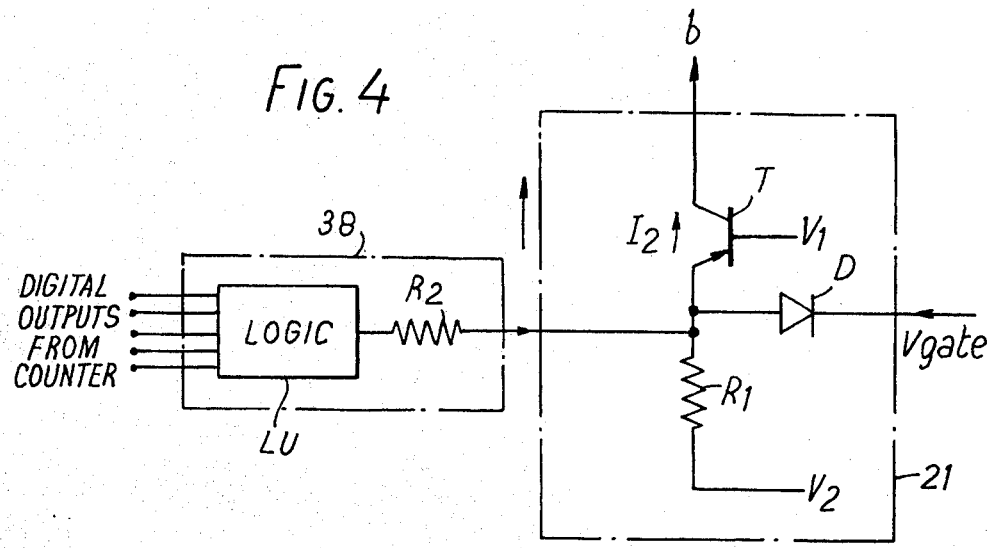
FIG. 4 shows a further current generator circuit including a logic unit for varying the characteristics of the current generator.

The gated bistable circuit 27 has one control input 28 connected to the output of multivibrator 26 and another control input 29 connected to a stop pulse generator 30 controlled by a change of state at the comparator output 13. The output 31 connected to the control line 17 is connected in turn to the second input 32 of an AND gate 33, the first input of the AND gate being connected to the output of the multivibrator 26. Pulses from an oscillator 34 are fed to the counter 35 via gate 33. Gate 33 is enabled when both inputs are at a 1 state, allowing the pulses from oscillator 34 to reach the counter 35. For resetting the counter, a reset pulse generator 36 is provided between the multivibrator and the counter 35, although other methods may be employed. If desired, the multivibrator may be locked to the oscillator. The digital output from the counter is used to drive a display 37 and also, if greater accuracy is desired, a lineariser 38 as shown in FIG. 4 described below.

The operation of the voltmeter is as follows:

The measurement cycle is controlled by the multivibrator 26 which provides clock pulses in the form of a square wave at its output (see FIG. 2) to give alternating changes of state between 0 and 1 at the input 28 of the gated bistable 27 and on one of the inputs of each of the gates 22, 23 and 33, and at the input of the reset pulse generator 36. The bistable provides a change of state at its output 31 each time it receives a stop pulse from the generator 30.

Figure 2:
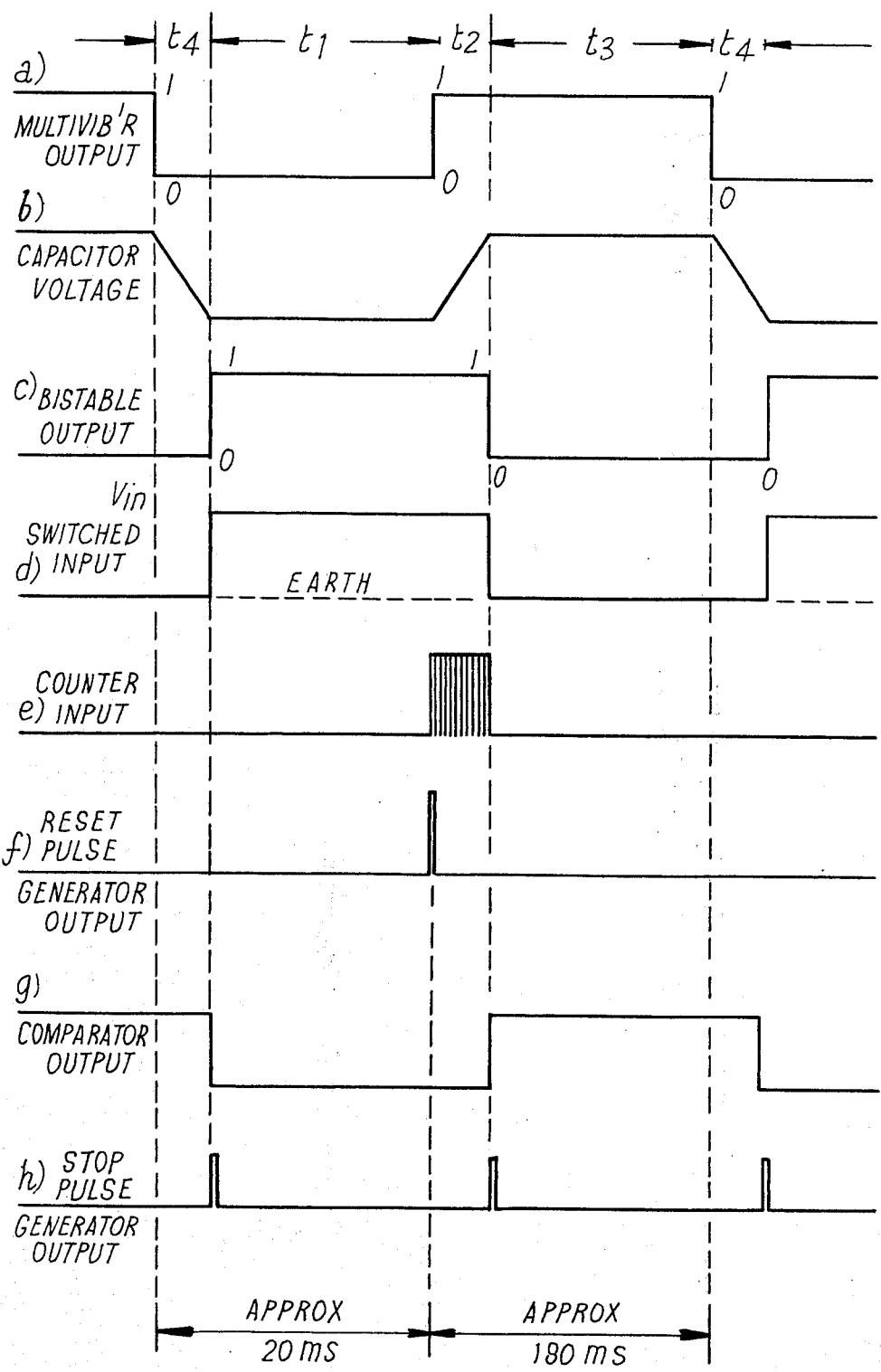
FIG. 2 shows voltage waveforms over one cycle of operation at points in the circuit of FIG. 1 referenced *a* to *h*.

The sequence of events starting from the end of $t_4$ in FIG. 2 is that the capacitor voltage has fallen to the same voltage as that at the input 12 of the comparator (i.e., earth). This has caused a change of state to occur at the comparator output 13 which in turn produces a pulse from the stop pulse generator 30. This pulse causes the bistable 27 to switch producing state 1 at its output and along control line 17, thus causing gate 22 to remove the output of the current generator 20 from the capacitor 18. This state on control line 17 also causes switch 15 to open and the switch 14 (via the invertor 16) to close so that the negative input 12 to the comparator 10 is switched from earth to $V_{in}$. After a period of time $t_1$ the multivibrator changes from a 0 to 1 state. This change of state causes the reset pulse generator 36 to feed to the counter 35 a very short duration reset pulse which must be less than half the period of the clock pulse. At the same time, the multivibrator output together with the output from the gated bistable 27 which is at a 1 state enables gates 22 and 23. Therefore, starting with no charge on capacitor 18 (or only a compensating charge for drift), and with $V_{in}$ shown as a positive voltage gate 23 will be enabled causing the appropriate current generator 21 to be turned on to allow the voltage on the positive input terminal of the comparator to rise to match the voltage on the negative input terminal.

Therefore, a voltage ramp is generated across the capacitor and a period of time $t_2$ will elapse depending upon the voltage level of $V_{in}$, before the voltages at the inputs of the comparator become equal.

The gate 33 is enabled by the multivibrator 26 and bistable 27 outputs during the period $t_2$ so that the oscillator 34 is connected to the counter 35, causing the counter to accumulate a number of pulses proportional to $t_2$. The period $t_2$ ends when the output 13 from the comparator changes state at the moment of equalisation of the voltages at the inputs 11, 12, thus producing a short duration stop pulse of less than one clock pulse width from the stop pulse generator 30 which switches the gated bistable 27 which in turn disconnects the comparator from the input voltage $V_{in}$ and connects it to earth by means of switches 14 and 15. This change of state of the bistable 27 switches off the current generator via the gate 23 and disconnects the oscillator from the counter, since gate 33 is no longer enabled. Counting takes place only during the period $t_2$ when the voltages at the inputs of the comparator are being equalised.

The period $t_3$ now occurs which allows the comparator to settle. At the end of $t_3$, the multivibrator changes from 1 to 0 state which again enables the gates 22 and 23 since the bistable output is still in the 0 state. The output from the comparator will switch on the appropriate current generator 20 to return the capacitor voltage back to earth (or reference potential) over the period $t_4$. When the output from the comparator changes state at the end of $T_4$ a second stop pulse is emitted by the generator 30 switching the gated bistable thus changing the state at the control line 17 to 1 so that the gates 22 and 23 are no longer enabled thereby returning the system to its initial condition. The overall cycle may take 200 ms, $t_4 + t_1$ taking 20 ms.

During period $t_3$, $t_4$, $t_1$, the counter is storing the result of the measurement. This will normally be displayed by the use of decoding, driving and display circuits. Optional display latches can be fitted between the counter and the decoder, enabling static display during period $t_2$ also.

Instead of arranging for the comparator to change state on equalisation of the input voltages, it may be desirable for the change of state to take place when a voltage difference has been reached. The comparator should have good common mode rejection.

The two settling periods $t_1$, $t_3$ given in the system for the comparator 10 are essential, and one advantage of this system is that if the comparator has an offset voltage at its input when a change of state occurs at the output, this offset will be stored in the capacitor at the end of $t_4$ and will also be stored in the capacitor in addition to the input voltage at the end of period $t_2$ and will thus not change the reading, i.e., the system rejects drift in the comparator amplifier.

A further advantage resulting from this system is that a high gain amplifier may be inserted between the common connection of the switches 14 and 15 and the negative input 12 to the comparator 10. The system can then operate at say $40\mu$ V per digit as opposed to say 1mV per digit without the high gain amplifier. Due to the present invention, the drift of this amplifier will also be rejected by the system i.e., at the end of $t_4$ the capacitor will store the input offset voltage to the comparator plus the input offset voltage to the amplifier times the gain plus the input voltage times the gain. Therefore, the only critical factor relating to the input amplifier is its gain and not offset voltage. The only critical items in the circuit with regards to offset voltages are switches 14 and 15. The two settling periods $t_1$ and $t_3$ allow the input amplifier to settle before making the measurement.

The method of rejecting drift may be shown mathematically as follows: At the start of $t_2$, which is the period of measurement, $v_c' = m V_1 + V_2$ wherein $V_c'$ is the capacitor voltage at the start of $t_2$, $m$ is the gain of the input amplifier, $V_1$ is the off-set voltage of the amplifier, and $V_2$ is the off-set voltage of the comparator At the end of $t_2$, $V_c'' = m V_{in} + m V_1 + V_2$ where $V_c''$ is the capacitor voltage at the end of $t_2$ Change in voltage on the capacitor during $t_2$ $$\Delta V_c = V_c'' - V_c' = mV_{in}$$

Also $$\Delta V_c = \frac{It_2}{C},$$

where I is the reference current. As the counter input is open for period $t_2$ the displayed number, i.e., $$\text{number of counts } (N) \text{ stored in the counter} = t_2 f = \frac{fV_c \cdot C}{I},$$

where f is the oscillator frequency $$\therefore N = \frac{f \cdot Cm V_{in}}{I}$$

It is preferable to make the period $t_3$ sufficiently long so that a reasonable display may be obtained without latches. The period $t_1$ is set to provide enough time for the amplifiers to settle but not enough time for the capacitor voltage or the amplifier offsets to drift.

Figure 3:
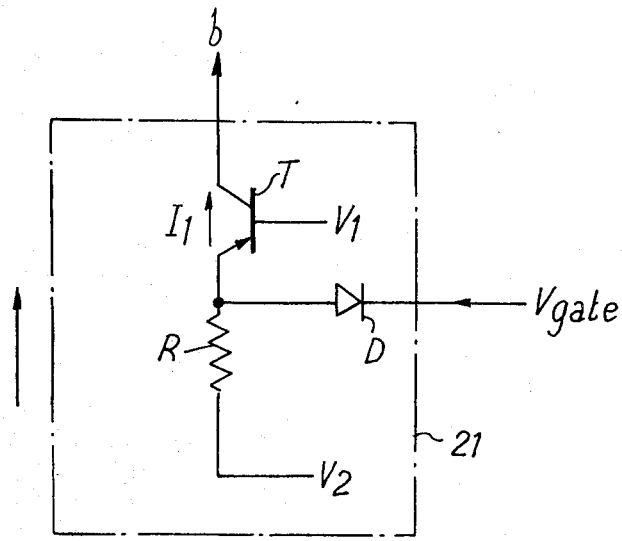
FIG. 3 is a current generator circuit, suitable for use in the present invention.

The current generator 21 may be a circuit as shown in FIG. 3 and includes a transistor T with a resistor R connected in the emitter path. A diode D is connected between the transistor and resistor. The voltages $V_1$ and $V_2$ are derived from sources not shown. With the gate voltage $V_{gate}$ more positive than $V_1$ by approximately one volt, the current $I_1$ from the collector of the transistor T will be defined by the differences in voltages $V_1$ and $V_2$, the base emitter voltage and the current gain of the transistor:

$$I_1 = \frac{(V_2 - V_1 - V_{be})}{R} \alpha,$$

where $\alpha$ is the current gain of the transistor $Ic/Ie$, and $V_{Be}$ is the base emitter voltage of the transistor.

When $V_{gate}$ is reduced to approximately 0.5 volt less than $V_1$, or lower, all the current through resistor R will pass through the diode D reducing $I_1$ to zero. $V_{gate}$ is therefore used to switch the current generator on and off and is controlled by gate 23.

Current generator 20 consists of a complementary circuit to this.

When using this system to indicate parameters which are not linear with voltage (e.g. a thermocouple output where the desired indication is in degrees Celcius or Fahrenheit and not voltage), it is desirable to make the characteristic of the measurement system non-linear This is achieved by varying the characteristics of the current generator by means of a logic unit as shown in FIG. 4.

Figure 5:
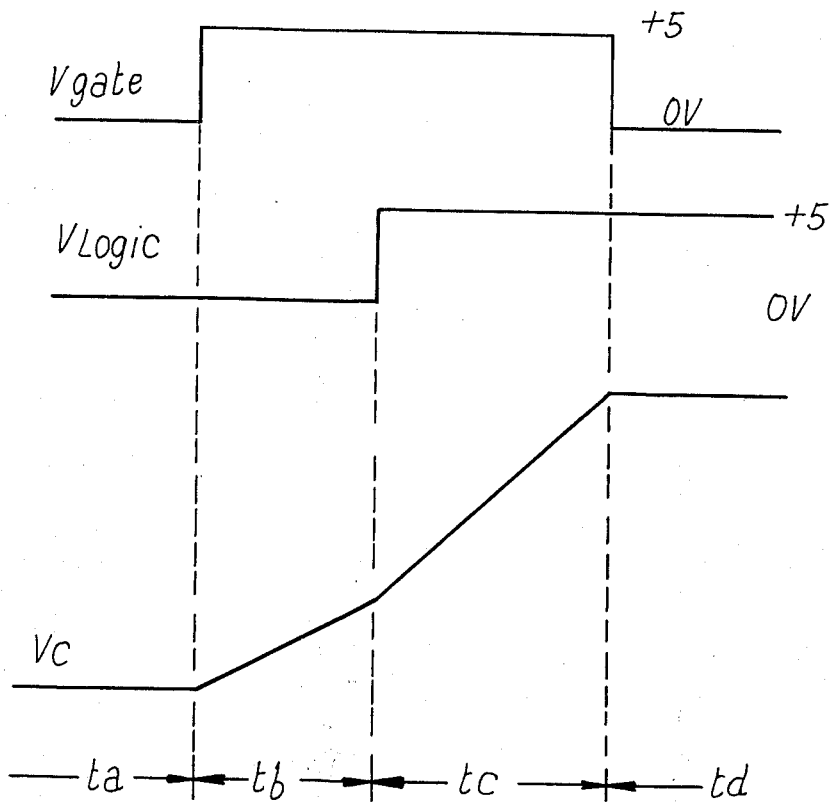
FIG. 5 shows inter alia the resulting characteristic of the current generator of FIG. 4.

The digital output from the counter 35 is used to control the logic unit. This unit detects the level of the reading as the counter is running up to the desired value and at predetermined points can modify the current generator by changing its output level. The resulting characteristic is shown in FIG. 5. Of the periods $t_a$ - $t_d$ indicated, $t_b$ and $t_c$ represent the measurement period $t_2$.

During period $t_a$, $V_{gate}$ is at 0 volts and therefore capacitor voltage remains unchanged. At the end of $t_a$, $V_{gate}$ changes from 0 to +5 volts. This turns on the current generator and allows the $V_c$ to increase linearly as shown in FIG. 5, the current from the transistor collector.

$$I_2 = \left[ \frac{(V_2 - V_1 - V_{be})}{R_1} - \frac{(V_1 + V_{be} - V_{logic})}{R_2} \right] \alpha$$

thus the current $I_2$ is dependant on the value of $V_{logic}$. During the period $t_b$, $V_{logic}$ is at 0 volts.

At the end of period $t_b$ the logic detects the digital output from the counter at which the characteristic is to be modified and changes its state at its output, $V_{logic}$ from 0 volts to 5 volts. This modifies the current generator as shown and a new slope is obtained during $t_c$. At the end of the period $t_c$, the gate voltage $V_{gate}$ is changed from +5 to 0 volts and the ramp ceases.

Modifications to the circuit of FIG. 4 may be effected to obtain the desired result, some of which are as follows:

1. $V_{logic}$ may change through any voltage range with the '0' state being other than 0 volts and the '1' state being other than 5 volts.

2. The change of $V_{logic}$ may be from '0' to a '1' state or from a '1' to a '0' state, it may start from either condition, may end in either condition, and may make a number of changes during a measurement to obtain the desired result.

3. The change of $V_{logic}$ may be from 1' to open circuit if a diode is used.

4. The logic element may for certain requirements be removed altogether and resistor $R_2$ connected directly to the counter outputs.

5. Other networks may be added similar to $R_2$ and the logic unit to obtain a number of changes in the characteristic.

6. The logic element may be used to control a circuit to effect analog variation of the current generator characteristics.

Similar modifications may be made to the other current generator 20 using a complementary circuit.

Although the circuit of FIG. 1 shows the inverting input to the comparator connected to $V_{in}$ and the non-inverting input connected to the capacitor, these connections may be reversed and to correct for the change in the comparator output polarity, the inputs to the gates 22 and 23 from the comparator output are reversed so that the input to gate 22 is now via the invertor 24 and the input to gate 23 is directly from the comparator output. The input to the stop pulse generator 30 is now also via invertor 24.

Although the values of $V_{in}$ have been described as positive values, the analog-to-digital converter of the present invention is capable of measuring both positive and negative values of $V_{in}$. The addition of polarity detection and indication will give comprehensive bipolar measurement capability.

The system described may be manufactured using descrete components, or integrated circuits.

Figure 6:
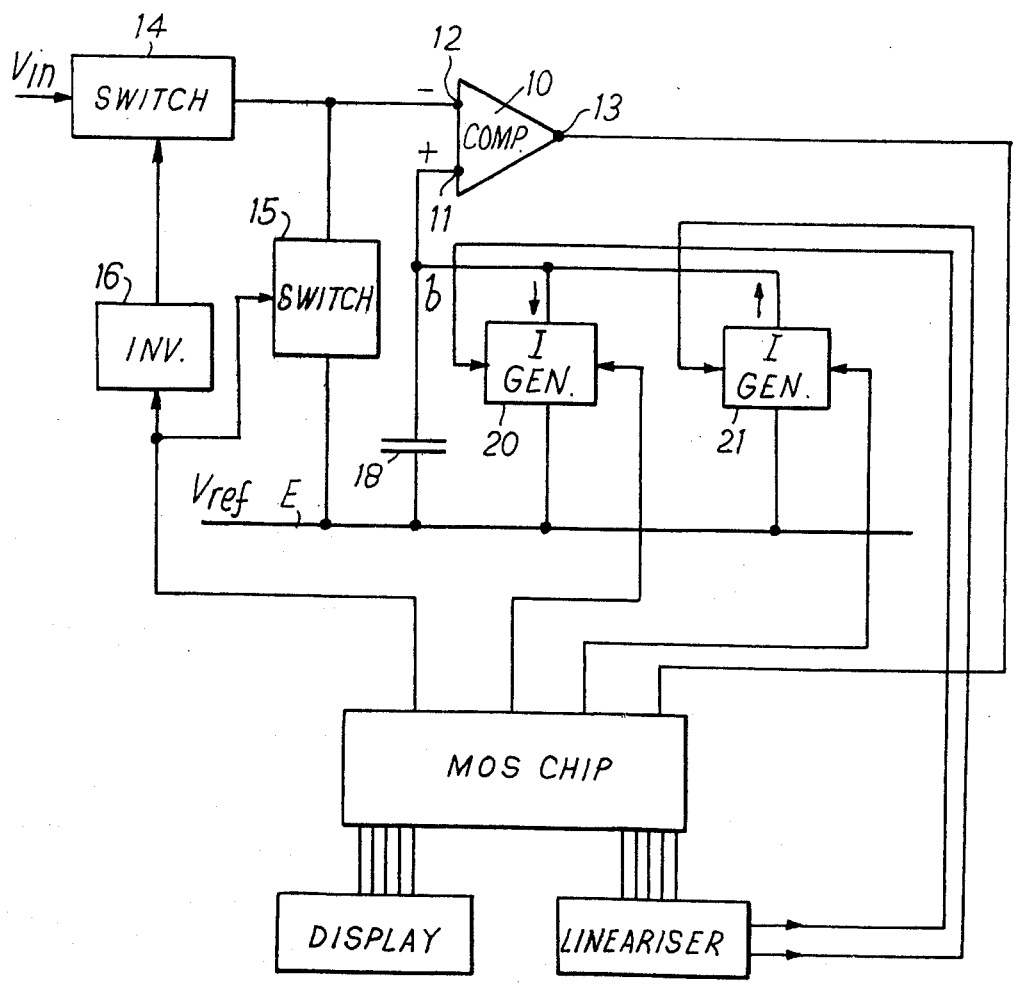
FIG. 6 is a block circuit diagram of a digital voltmeter incorporating an alternative embodiment of the present invention in which use is made of a custom integrated circuit.

The circuit can be rearranged as shown on FIG. 6 so that all logic is incorporated in a custom integrated circuit (MOS chip). By comparison with FIG. 1, it is noted that the gates 22 and 23, the invertor 24, the stop pulse generator 30, together with the multivibrator 26, the gated bistable 27, the oscillator 34, gate 33, counter and reset pulse generator have all been replaced by this single MOS chip. Whilst the gates can be incorporated in the chip, the other components are not and more complex circuitry is used to ensure that the chip carries the means necessary to control the switches, current generators and effect counting. The chip can comprise any arrangement of circuitry provided the appropriate output signals control the circuit of FIG. 6 in the manner described in relation to FIG. 1.

I claim:

1. A bipolar analog-to-digital converter comprising a comparator having first and second inputs and an output, first and second switches for alternately connecting first and second signal levels to said first input, said first level comprising an input signal to be converted and said second signal level comprising a reference level, a storage device connected between said second input and said reference level, current generator means for delivering either a positive or negative current to said second input, depending upon input signal polarity, during a counting period while said first switch is connecting said first level to said first input to charge the storage device until a change of state occurs at the output of the comparator, selector means for determining the polarity of the current from said generator means depending upon the state of the output from the comparator, a counting pulse generator, counter means for determining the number of counting pulses emitted from the pulse generator during said counting period in which the current generator means is applied to the comparator before said change of state occurs; and a clocking generator operative to generate control signals controlling periods of operation of said converter and including generator means operative for generating a stop signal each time the comparator changes state, said periods including a first period during which said control signals actuate said switches to apply said first input level to said first input of said comparator while the comparator settles, a second counting period initiated by said clocking generator during which said control signals initiate delivery of pulses to said counter means and actuate said current generator means to apply current of selected polarity to said storage device and to said second input of the comparator until its output changes state, a third period initiated by the latter change of state during which said control signals disable said current generator means reverse said switches to substitute said second reference level for said first input level and cease the delivery of pulses to said counter means, and a fourth period initiated by said clocking generator during which said control signals actuate current generator means to apply a current of reversed polarity to said storage device and to said second input to the comparator until its output again changes state and actuates the generator means to deliver a stop signal for initiating a succeeding first period.

2. An analog-to-digital converter according to claim 1, wherein the change of state at the output of the comparator takes place when a predetermined voltage difference has been reached due to the approach of said first and second signal levels toward equality 3. An analog-to-digital converter according to claim 1, wherein said current generator means comprises separate positive and negative current generators and said selector means comprises a first and second gate, one of said gates being connected to said positive current generator and the other to said negative current generator, and one of said gates being further connected to the output of the comparator, the other being connected to said comparator output through an inverter.

4. An analog-to-digital converter according to claim 1, wherein said current generator means includes linearising means for modifying the value of the positive or negative current output dependent on the number of pulses in said counter means.

5. An analog-to-digital converter according to claim 4, wherein said linearising means includes a logic unit which detects the level of the counterreading and at predetermined points modifies the value of the current output from the current generator means.

6. An analog-to-digital converter according to claim 1 wherein said clocking generator includes a gated bistable having a first input connected with said multivibrator, said stop pulse generator emitting a stop pulse at each change of state of the comparator output, said stop pulse being coupled to a second input to the gated bistable.

7. An analog-to-digital converter according to claim 1, wherein said reference level is at a voltage other than earth potential.

8. An analog-to-digital converter according to claim 1, wherein a third gate connects said counter means to said counting pulse generator, and a reset pulse generator operative to emit a reset pulse at the start of the counting period under the action of said clocking generator means for resetting said counter means.

9. An analog-to-digital converter according to claim 8, wherein said stop pulse generator emits a stop pulse at the end of the counting period to cause said bistable to open the first switch and disable the third gate.

* * * * *